(12) United States Patent
Kanesada

(10) Patent No.: US 9,929,303 B2
(45) Date of Patent: Mar. 27, 2018

(54) METHOD OF MANUFACTURING SOLID-STATE IMAGE SENSOR

(71) Applicant: CANON KABUSHIKI KAISHA, Tokyo (JP)

(72) Inventor: Takayasu Kanesada, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/600,978

(22) Filed: May 22, 2017

(65) Prior Publication Data
US 2017/0358622 A1    Dec. 14, 2017

(30) Foreign Application Priority Data

Jun. 9, 2016  (JP) ................. 2016-115706

(51) Int. Cl.
*H01L 31/18* (2006.01)
*H01L 27/146* (2006.01)
*H01L 31/0232* (2014.01)

(52) U.S. Cl.
CPC .......... *H01L 31/18* (2013.01); *H01L 27/1462* (2013.01); *H01L 27/1463* (2013.01); *H01L 27/14621* (2013.01); *H01L 27/14623* (2013.01); *H01L 27/14625* (2013.01); *H01L 27/14627* (2013.01); *H01L 27/14636* (2013.01); *H01L 27/14645* (2013.01); *H01L 27/14685* (2013.01); *H01L 31/0232* (2013.01);
(Continued)

(58) Field of Classification Search
CPC ............. H01L 27/146; H01L 27/14601; H01L 27/14607; H01L 27/14609; H01L 27/14612; H01L 27/1462; H01L 27/14627; H01L 31/0232; H01L 31/02327; H01L 31/18; H01L 21/76819; H01L 21/76829; H01L 21/76831
See application file for complete search history.

(56) References Cited

U.S. PATENT DOCUMENTS

| 8,846,436 B2 | 9/2014 | Suzuki et al. |
| 9,391,227 B2 | 7/2016 | Sawayama et al. |
| (Continued) | | |

FOREIGN PATENT DOCUMENTS

| JP | 2012-164945 A | 8/2012 |
| JP | 2014-036036 A | 2/2014 |

*Primary Examiner* — Eduardo A Rodela
(74) *Attorney, Agent, or Firm* — Fitzpatrick, Cella, Harper & Scinto

(57) ABSTRACT

A method of manufacturing a solid-state image sensor is provided. A first insulating member and an electrically conductive member is formed above a semiconductor substrate. A connecting portion of an upper surface of the electrically conductive member is covered with part of the first insulating member. First openings corresponding to the photoelectric conversion units are formed in the first insulating member. A second insulating member covering the first insulating member is then formed. The second insulating member is partially removed to expose the part of the first insulating member covering the connecting portion. A third insulating member that covers the first and second insulating members is then formed. The third insulating member is partially removed to expose the second insulating member. A second opening to expose the connecting portion is then formed to form a plug.

17 Claims, 9 Drawing Sheets

(52) U.S. Cl.
CPC .. *H01L 27/14609* (2013.01); *H01L 27/14612* (2013.01); *H01L 27/14643* (2013.01)

(56) References Cited

U.S. PATENT DOCUMENTS

| | | | |
|---|---|---|---|
| 9,608,031 B2 | 3/2017 | Kanesada | |
| 2009/0278967 A1* | 11/2009 | Toumiya | H01L 27/14625 |
| | | | 348/294 |
| 2012/0202309 A1* | 8/2012 | Kondo | H01L 27/14687 |
| | | | 438/69 |
| 2014/0070288 A1* | 3/2014 | Tomimatsu | H01L 27/14629 |
| | | | 257/292 |
| 2016/0373665 A1* | 12/2016 | Ogino | H04N 5/357 |
| 2017/0263670 A1* | 9/2017 | Kawahara | H01L 27/14685 |

* cited by examiner

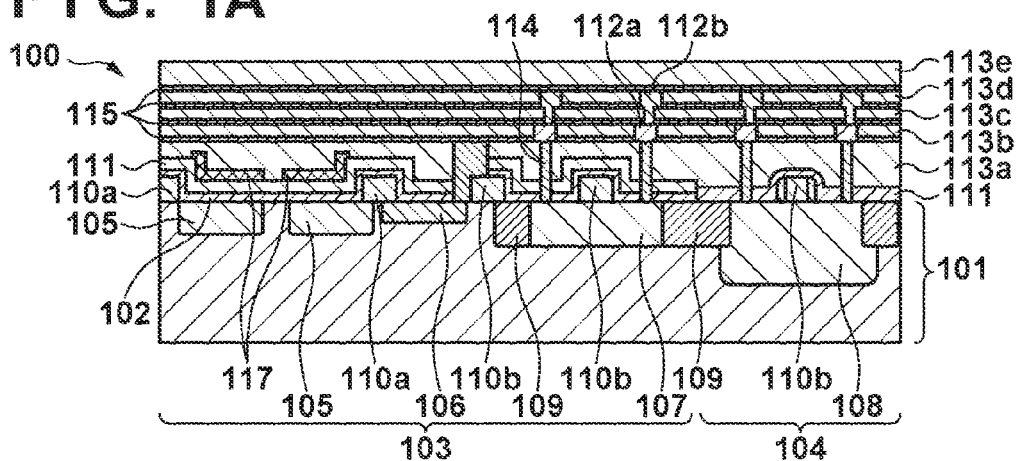
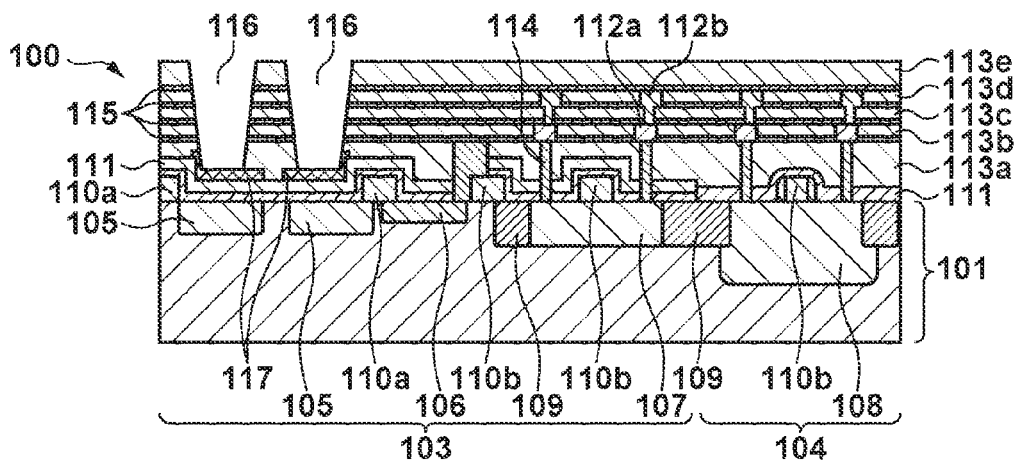
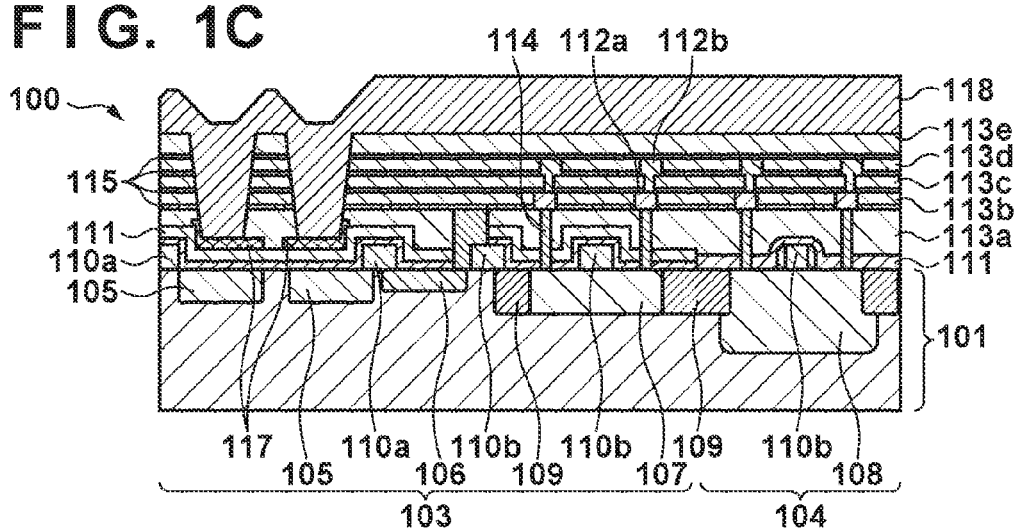

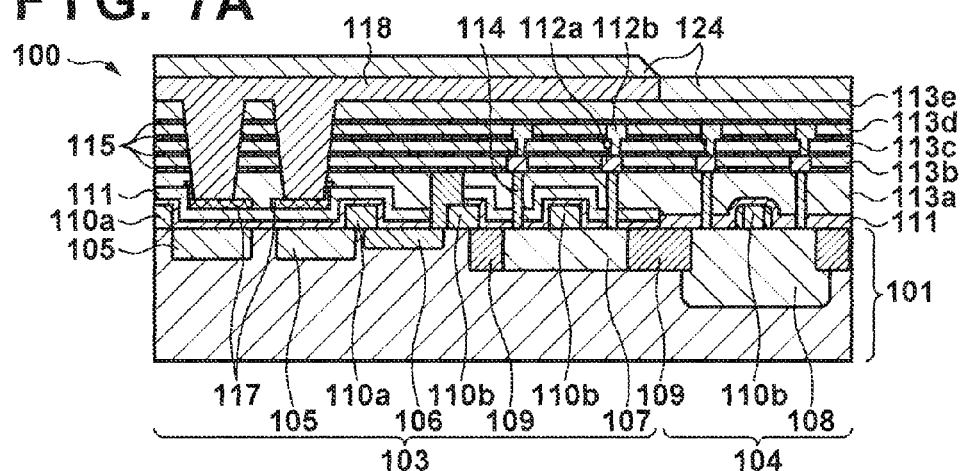
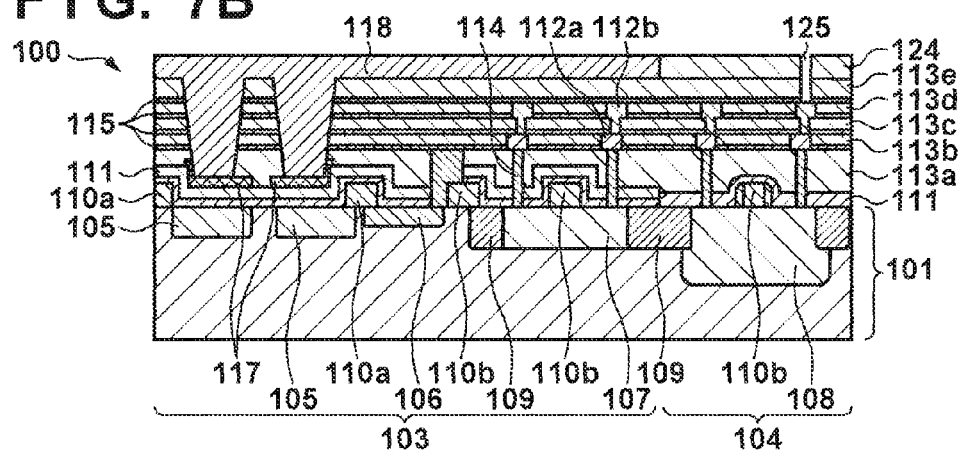
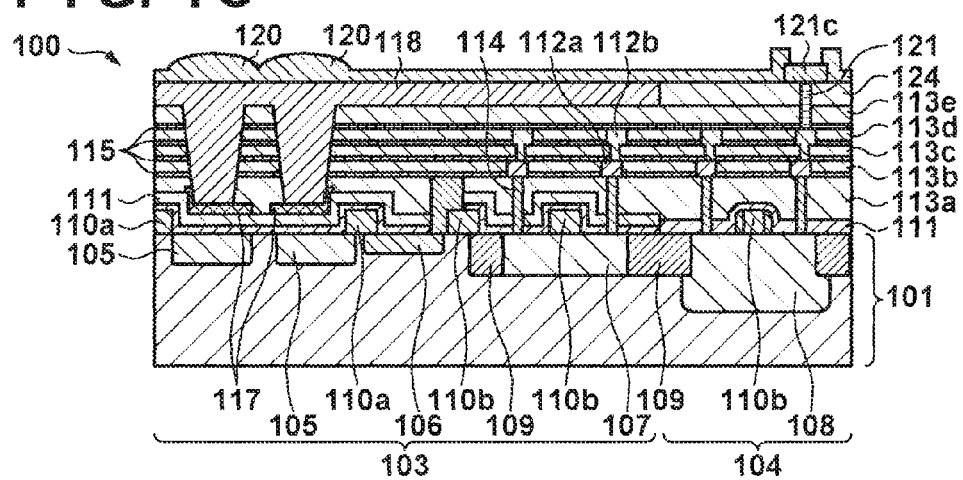

METHOD OF MANUFACTURING SOLID-STATE IMAGE SENSOR

BACKGROUND OF THE INVENTION

Field of the Invention

The present invention relates to a method of manufacturing a solid-state image sensor.

Description of the Related Art

There is proposed a solid-state image sensor including a light waveguide to increase the amount of light entering a photoelectric conversion unit. In Japanese Patent Laid-Open Nos. 2012-164945 and 2014-036036, an opening is formed in an insulating member of a low refractive index, and an insulating member of a high refractive index is formed on this insulating member. A portion of the insulating member of the high refractive index arranged in the opening forms the core of a light waveguide. The insulating member of the high refractive index is formed not only on the pixel region but also on the peripheral region. If the insulating member of the high refractive index remains when forming a plug in the peripheral region, it is difficult to form a through hole used to arrange the plug. Hence, in Japanese Patent Laid-Open Nos. 2012-164945 and 2014-036036, the through hole is formed after the portion of the insulating member of the high refractive index arranged on the peripheral region is removed.

SUMMARY OF THE INVENTION

In Japanese Patent Laid-Open Nos. 2012-164945 and 2014-036036, only the portion of the insulating member of the high refractive index located on the peripheral region is removed. For this reason, a step is generated on the upper surface of the insulating member. Because of this step, planarization of the upper surface of an insulating film formed later may be insufficient, or the solid-state image sensor may become tall. As a result, image quality obtained by the solid-state image sensor lowers. An aspect of the present invention provides a technique for reducing a step generated on the upper surface of an insulating member used to form a light waveguide.

According to some embodiments, a method of manufacturing a solid-state image sensor is provided. The method includes: forming a first insulating member and an electrically conductive member above a semiconductor substrate including a first region in which a plurality of photoelectric conversion units are arranged and a second region in which a circuit configured to process signals from the plurality of photoelectric conversion units is arranged, wherein the first insulating member covers the first region and the second region, the electrically conductive member is arranged above at least the second region, and a connecting portion of an upper surface of the electrically conductive member, which is used to connect a plug, is covered with part of the first insulating member; forming a plurality of first openings corresponding to the plurality of photoelectric conversion units in the first insulating member; forming a second insulating member above the first region and the second region after the forming the plurality of first openings, wherein the second insulating member covers the first insulating member, and a portion of the second insulating member formed in the first opening functions as a waveguide; partially removing the second insulating member such that the part of the first insulating member covering the connecting portion is exposed; forming a third insulating member that covers the first insulating member and the second insulating member above the first region and the second region after the partially removing the second insulating member; partially removing the third insulating member formed above the first region such that the second insulating member is exposed; forming a second opening to expose the connecting portion of the electrically conductive member in the first insulating member and the third insulating member after the partially removing the third insulating member; and forming the plug in the second opening.

Further features of the present invention will become apparent from the following description of exemplary embodiments (with reference to the attached drawings).

BRIEF DESCRIPTION OF THE DRAWINGS

FIGS. 1A to 1C are views for explaining a solid-state image sensor manufacturing method according to some embodiments;

FIGS. 7A to 7C are views for explaining a solid-state image sensor manufacturing method according to some embodiments;

DESCRIPTION OF THE EMBODIMENTS

Figure 2A:
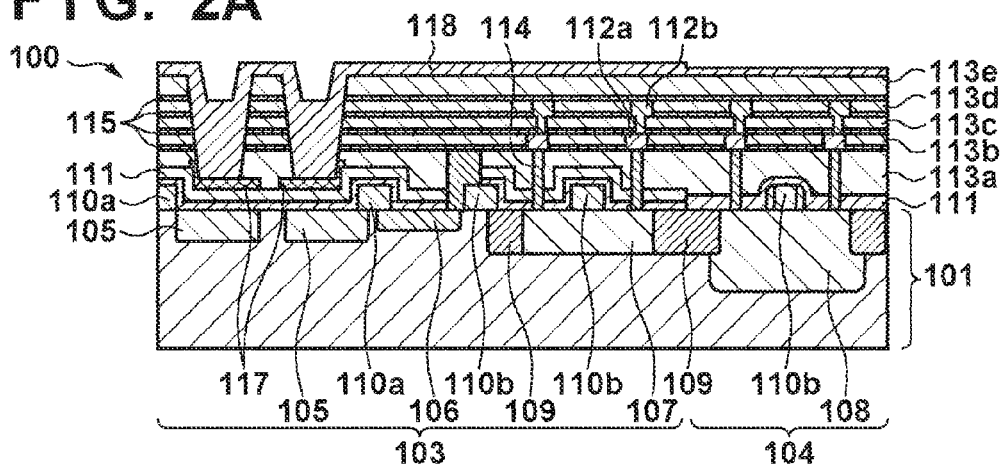
FIGS. 2A to 2C are views for explaining a solid-state image sensor manufacturing method according to some embodiments.

Embodiments of the present invention will now be described with reference to the accompanying drawings. The same reference numerals denote the same elements throughout various embodiments, and a repetitive description thereof will be omitted. The embodiments can appropriately be changed or combined. In the following explanation, a case in which signal charges are electrons will be described. However, the signal charges may be holes. If the signal charges are holes, the conductivity types of semiconductor regions to be described below are replaced.

First Embodiment

A method of manufacturing a solid-state image sensor according to the first embodiment of the present invention will be described with reference to the accompanying drawings. FIGS. 1A to 4C are schematic views of the sectional structure of a solid-state image sensor in the steps according to this embodiment. In each step, the solid-state image sensor halfway through the manufacture will also be referred to as a solid-state image sensor 100.

First, a semiconductor substrate 101 of the solid-state image sensor 100 is prepared. The semiconductor substrate 101 is a semiconductor material portion of members that constitute the solid-state image sensor 100. For example, the semiconductor substrate 101 includes a semiconductor wafer in which a semiconductor region is formed by a known semiconductor manufacturing process. An example of the semiconductor material is silicon. The interface between the semiconductor material and another material is a principal surface 102 of the semiconductor substrate 101. Another material is, for example, a thermal oxide film (not shown) that is arranged on the semiconductor substrate 101 and is in contact with the principal surface 102 of the semiconductor substrate 101.

In this embodiment, a known semiconductor substrate can be used as the semiconductor substrate 101. A p-type semiconductor region and an n-type semiconductor region are arranged in the semiconductor substrate 101. The semiconductor substrate 101 includes an imaging region 103 in which a plurality of photoelectric conversion units are arranged, and a peripheral region 104 in which a signal processing circuit configured to process signals from the plurality of photoelectric conversion units is arranged. The imaging region 103 and the peripheral region 104 will be described later.

Note that in this specification, a surface parallel to the principal surface 102 will simply be referred to as a plane. For example, of the principal surface 102, a portion in which photoelectric conversion units to be described later are arranged, or a portion in the channel of a MOS transistor may be used as a reference for a plane. Additionally, in this specification, a surface intersecting, for example, orthogonal to a plane will simply be referred to as a section.

In the step shown in FIG. 1A, the semiconductor regions are formed in the semiconductor substrate 101, and gate electrodes and multiple wiring layers are formed on the semiconductor substrate 101. In the imaging region 103 of the semiconductor substrate 101, photoelectric conversion units 105, a floating diffusion (to be referred to as an FD hereinafter) 106, a well 107 for pixel transistors, and source and drain regions are formed. The photoelectric conversion unit 105 is, for example, a photodiode. The photoelectric conversion unit 105 includes the n-type semiconductor region arranged in the semiconductor substrate 101. Electrons generated by photoelectric conversion are collected by the n-type semiconductor region of the photoelectric conversion unit 105. The FD 106 is an n-type semiconductor region. Electrons generated in the photoelectric conversion unit 105 are transferred to the FD 106 and converted into a voltage. The FD 106 is electrically connected to the input node of an amplification portion. Instead, the FD 106 may electrically be connected to a signal output line. In this embodiment, the FD 106 is electrically connected a gate electrode 110b of an amplification transistor via a plug 114. The source and drain regions of the amplification transistor configured to amplify a signal, a reset transistor configured to reset the input node of the amplification transistor, and the like are formed in the well 107 for pixel transistors.

A well 108 for peripheral transistors is formed in the peripheral region 104 of the semiconductor substrate 101. The source and drain regions of peripheral transistors that constitute a signal processing circuit are formed in the well 108 for peripheral transistors. An element isolation portion 109 may be formed in the semiconductor substrate 101. The element isolation portion 109 electrically isolates the pixel transistors or the peripheral transistors from other elements.

The element isolation portion 109 is STI (Shallow Trench Isolation), LOCOS (LOCal Oxidation of Silicon), or the like.

Additionally, in this step, a transfer gate electrode 110a and the gate electrode 110b are formed. The transfer gate electrode 110a and the gate electrode 110b are arranged on an oxide film (not shown) on the semiconductor substrate 101. The transfer gate electrode 110a controls charge transfer between the photoelectric conversion unit 105 and the FD 106. The gate electrode 110b is the gate of a pixel transistor or a peripheral transistor.

Furthermore, in this step, a protective layer 111 is formed on the semiconductor substrate 101. The protective layer 111 is, for example, a silicon nitride film. The protective layer 111 may be formed from a plurality of layers including a silicon nitride film and a silicon oxide film. The protective layer 111 may have at least one of a function of reducing damage to the photoelectric conversion units in the subsequent step, a function of preventing reflection, and a function of preventing diffusion of a metal in a silicide process. In addition, an etching stop member 117 is formed on the opposite side of the semiconductor substrate 101 with respect to the protective layer 111. The area of the etching stop member 117 may be larger than the area of the bottom of an opening 116 to be formed later. Note that the protective layer 111 and the etching stop member 117 need not always be formed. In this specification, an area is the area of a surface parallel to the principal surface 102, unless specifically stated otherwise. For example, the area of a through hole 125 to be described below is the area of a region on a plane where the through hole 125 is projected onto the plane.

Next, an insulating member and an electrically conductive member are formed on the semiconductor substrate 101. In this embodiment, the insulating member is formed from a plurality of interlayer dielectric films 113a to 113e and insulating films 115 and covers the imaging region 103 and the peripheral region 104. The plurality of interlayer dielectric films 113a to 113e and the insulating films 115, which constitute the insulating member, will simply be referred to as the interlayer dielectric films 113 and the like hereinafter. The electrically conductive member is formed from a first wiring layer 112a and a second wiring layer 112b, and includes at least a portion arranged on the imaging region 103 and a portion arranged on the peripheral region 104. In this embodiment, the first wiring layer 112a and the second wiring layer 112b are formed by a damascene method. For the sake of convenience, the interlayer dielectric films will be referred to as the first to fifth interlayer dielectric films 113a to 113e sequentially from the side close to the semiconductor substrate 101. The first to fifth interlayer dielectric films 113a to 113e are formed by, for example, plasma CVD. The film thickness of each interlayer dielectric film may be, for example, 120 nm to 1000 nm. The upper surface of the second wiring layer 112b includes a portion (to be referred to as a connecting portion hereinafter) used to connect a plug 121 to be described later. The connecting portion of the second wiring layer 112b is covered with part of the fifth interlayer dielectric film 113e and the insulating film 115.

A step of forming the interlayer dielectric films 113 and the like and the electrically conductive member on the semiconductor substrate 101 will be described below in detail. First, the first interlayer dielectric film 113a is formed on the imaging region 103 and the peripheral region 104. The surface of the first interlayer dielectric film 113a on the opposite side of the semiconductor substrate 101 may be planarized as needed. Through holes are formed in the first interlayer dielectric film 113a. The plug 114 that electrically connects the electrically conductive member of the first wiring layer 112a and the semiconductor region of the semiconductor substrate 101 is arranged in each through hole. The plug 114 is made of an electrically conductive material. For example, the plug 114 is made of tungsten.

Next, the second interlayer dielectric film 113b is formed on the opposite side of the semiconductor substrate 101 with respect to the first interlayer dielectric film 113a. Of the second interlayer dielectric film 113b, a portion corresponding to the region where the electrically conductive member of the first wiring layer 112a is arranged is removed by etching. After that, a metal film as the material of the first wiring layer is formed on the imaging region 103 and the peripheral region 104. Then, the metal film is removed by a method such as CMP until the second interlayer dielectric film is exposed. According to this procedure, the electrically conductive member that forms the wiring of the first wiring layer 112a is arranged in a predetermined pattern.

Subsequently, the third interlayer dielectric film 113c and the fourth interlayer dielectric film 113d are formed on the imaging region 103 and the peripheral region 104. Of the fourth interlayer dielectric film 113d, a portion corresponding to the region where the electrically conductive member of the second wiring layer 112b is arranged is removed by etching. Next, of the third interlayer dielectric film 113c, a portion corresponding to the region where a plug that electrically connects the electrically conductive member of the first wiring layer 112a and the electrically conductive member of the second wiring layer 112b is arranged is removed by etching. After that, a metal film as the material of the second wiring layer and the plug is formed on the imaging region 103 and the peripheral region 104. Then, the metal film is removed by a method such as CMP until the fourth interlayer dielectric film is exposed. According to this procedure, the wiring pattern of the second wiring layer 112b and the wiring pattern of the plug are obtained. Note that after the third interlayer dielectric film 113c and the fourth interlayer dielectric film 113d are formed, the portion corresponding to the region where the plug that electrically connects the electrically conductive member of the first wiring layer 112a and the electrically conductive member of the second wiring layer 112b is arranged may be removed by etching first.

Finally, the fifth interlayer dielectric film 113e is formed on the imaging region 103 and the peripheral region 104. The surface of the fifth interlayer dielectric film 113e on the opposite side of the semiconductor substrate 101 may be planarized by a method such as CMP as needed.

Note that the first wiring layer 112a and the second wiring layer 112b may be formed by a method other than the damascene method. An example of a method other than the damascene method will be described. After the first interlayer dielectric film 113a is formed, a metal film as the material of the first wiring layer is formed on the imaging region 103 and the peripheral region 104. Next, of the metal film, a portion other than the region where the electrically conductive member of the first wiring layer 112a is arranged is removed by etching. The wiring pattern of the first wiring layer 112a is thus obtained. After that, the second interlayer dielectric film 113b and the third interlayer dielectric film 113c are formed, and the second wiring layer 112b is formed in a similar manner. After the second wiring layer 112b is formed, the fourth interlayer dielectric film 113d and the fifth interlayer dielectric film 113e are formed. The surfaces of the third interlayer dielectric film 113c and the fifth interlayer dielectric film 113e on the opposite side of the semiconductor substrate 101 may be planarized.

The first wiring layer 112a and the second wiring layer 112b are arranged to different heights with respect to the principal surface 102 of the semiconductor substrate 101 as a reference. In this embodiment, the electrically conductive members of the first wiring layer 112a and the second wiring layer 112b are made of copper. The electrically conductive members may be made of any conductive material other than copper. Except the portions electrically connected by the plug, the electrically conductive member of the first wiring layer 112a and the electrically conductive member of the second wiring layer 112b are insulated from each other by the third interlayer dielectric film 113c. Note that the number of wiring layers is not limited to 2, and a single wiring layer or three or more layers may be formed.

The insulating film 115 having at least one of the functions of an etching stop film and a metal diffusion preventing film may be arranged between the interlayer dielectric films. In this embodiment, the plurality of interlayer dielectric films 113a to 113e are silicon oxide films. A silicon nitride film serves as an etching stop film for a silicon oxide film. The insulating film 115 may be made of silicon carbide or silicon carbonitride. The film thickness of the insulating film 115 may be about 10 nm to 200 nm. Note that the insulating film 115 need not always be arranged.

In the step shown in FIG. 1B, the plurality of openings 116 corresponding to the plurality of photoelectric conversion units 105 are formed in the interlayer dielectric films 113 and the like. The openings 116 are formed such that of the plurality of interlayer dielectric films 113a to 113e, portions located on the connecting portion of the second wiring layer 112b are left. First, an etching mask pattern (not shown) is formed on the opposite side of the semiconductor substrate 101 with respect to the interlayer dielectric film 113e. The etching mask pattern covers portions other than the regions where the openings 116 should be arranged. In other words, the etching mask pattern has openings in the regions where the openings 116 should be arranged. The etching mask pattern is, for example, a photoresist patterned by photolithography and development.

Next, the plurality of interlayer dielectric films 113a to 113e and the insulating films 115 are etched using the etching mask pattern as a mask. The openings 116 are thus formed. The openings 116 may be formed by a plurality of times of etching under different conditions. After the etching, the etching mask pattern may be removed.

When the etching stop member 117 is arranged, etching may be performed in the step of FIG. 1B until the etching stop member 117 is exposed. In the etching condition to etch the interlayer dielectric film 113a, the etching rate of the etching stop member 117 may be lower than the etching rate of the interlayer dielectric film 113a. If the interlayer dielectric film 113a is a silicon oxide film, a silicon nitride film or silicon oxynitride film can be used as the etching stop member 117. The etching stop member 117 may be exposed by a plurality of times of etching under different conditions.

The opening 116 may extend through only some of the first to fifth interlayer dielectric films 113a to 113e. A recess provided in the interlayer dielectric films 113a to 113e may be the opening 116. The planar shape of the opening 116 is a closed loop shape such as a circle or a rectangle. Instead, the planar shape of the opening 116 may be a shape like a trench extending over the plurality of photoelectric conversion units 105. That is, in this specification, if a region on a certain plane where the interlayer dielectric film 113e is not arranged is surrounded or sandwiched by regions where the interlayer dielectric film 113e is arranged, the interlayer dielectric film 113e has the opening 116.

The opening 116 is arranged such that at least part of the opening 116 overlaps the insulating photoelectric conversion unit 105 on a plane. That is, if the opening 116 and the photoelectric conversion unit 105 are projected onto the same plane, there exists a region where both the opening 116 and the photoelectric conversion unit 105 are projected on the same plane.

In this embodiment, the openings 116 are formed in a region overlapping the photoelectric conversion units 105, and no opening 116 is formed on the peripheral region 104. Instead, the openings 116 may be formed on the peripheral region 104. In this case, the density of the openings 116 formed on the imaging region 103 may be higher than the density of the openings 116 formed on the peripheral region 104. The density of the openings 116 can be determined based on the number of openings 116 arranged per unit area. Alternatively, the density of the openings 116 can be determined based on the ratio of the area occupied by the openings 116 per unit area.

Next, another insulating member is formed on the imaging region 103 and the peripheral region 104 of the semiconductor substrate 101 in a series of steps shown in FIGS. 1C to 3A. In this embodiment, this insulating member is formed from a first waveguide member 118, a second waveguide member 122, and a low refractive index member 123. The first waveguide member 118, the second waveguide member 122, and the low refractive index member 123, which constitute the insulating member, will simply be referred to as the first waveguide member 118 and the like. The refractive index of the low refractive index member 123 is lower than the refractive index of the first waveguide member 118 and the second waveguide member 122. The first waveguide member 118 and the second waveguide member 122 are partially formed in the openings 116. The low refractive index member 123 is formed above the openings 116. The first waveguide member 118 and the like cover the interlayer dielectric films 113 and the like. The first waveguide member 118 and the like partially enter the openings 116, and the portions formed in the openings 116 function as a light waveguide. The first waveguide member 118 and the like may be made of a material different from the interlayer dielectric films 113 and the like. For example, if the first waveguide member 118 and the like and the interlayer dielectric films 113 and the like are in contact with each other, the materials on both sides of the interface may be different from each other.

The series of steps shown in FIGS. 1C to 3A will be described below in detail. The first waveguide member 118 can be formed by deposition based on CVD or sputtering or application of an organic material represented by a polyimide-based polymer. Note that the first waveguide member 118 may be formed in a plurality of steps under different conditions. For example, in the first step, the first waveguide member 118 may be formed under a condition to increase adhesion to an underlying layer. In the next step, the first waveguide member 118 may be formed under a condition to improve the burying characteristic in the openings 116. Alternatively, the first waveguide member 118 may be formed by sequentially forming a plurality of different materials. For example, the first waveguide member 118 may be formed by depositing a silicon nitride film first and then depositing an organic material of high burying performance. If the first interlayer dielectric film 113a is etched in the step of FIG. 1B until the etching stop member 117 is exposed, the first waveguide member 118 is arranged in contact with the etching stop member 117.

The material of the first waveguide member 118 may have a refractive index higher than that of the interlayer dielectric films 113a to 113e. If the interlayer dielectric films 113a to 113e are silicon oxide films, a silicon nitride film or a polyimide-based organic material can be used as the material of the first waveguide member 118. The refractive index of the silicon nitride film is about 2.0. The refractive index of the silicon oxide films on the periphery is about 1.4. For this reason, based on the Snell's law, light is reflected by the interface between the first waveguide member 118 and the interlayer dielectric films 113a to 113e. This can confine the light in the first waveguide member 118. In addition, the hydrogen content of the silicon nitride film can be increased, and the dangling bond of the semiconductor substrate 101 can be terminated by the hydrogen supply effect. This can reduce noise such as a white spot defect. The refractive index of the polyimide-based organic material is about 1.7. The burying characteristic of the polyimide-based organic material is better than that of a silicon nitride film. The material of the first waveguide member 118 may appropriately be selected in consideration of the balance between an optical characteristic such as a refractive index difference and an advantage in the manufacturing process.

The positional relationship between the plurality of interlayer dielectric films 113a to 113e and the first waveguide member 118 arranged in the opening 116 will be described here. On a given plane, the region where the first waveguide member 118 is arranged is surrounded by or sandwiched between regions where the plurality of interlayer dielectric films 113a to 113e are arranged. In other words, first portions of the plurality of interlayer dielectric films 113a to 113e, second portions different from the first portions, and the first waveguide member 118 arranged in the opening 116 are aligned in a direction intersecting the direction in which the photoelectric conversion unit 105 and the first waveguide member 118 arranged in the opening 116 are aligned. The direction intersecting the direction in which the photoelectric conversion unit 105 and the first waveguide member 118 arranged in the opening 116 are aligned is, for example, a direction parallel to the principal surface 102 of the semiconductor substrate 101.

Part of the first waveguide member 118 is arranged at a position overlapping the photoelectric conversion unit 105 on the semiconductor substrate 101. The peripheral region interlayer dielectric films 113a to 113e are arranged around the portion of the first waveguide member 118. The refractive index of the material of the first waveguide member 118 may be higher than the refractive index of the plurality of interlayer dielectric films 113a to 113e. By the refractive index relationship, of light that has entered the first waveguide member 118, the amount of light leaking to the plurality of interlayer dielectric films 113a to 113e can be reduced. For this reason, if at least part of the first waveguide member 118 is arranged while overlapping the photoelectric conversion unit 105, the amount of light that enters the photoelectric conversion unit 105 can be increased.

The refractive index of the first waveguide member 118 may be lower than the refractive index of the plurality of interlayer dielectric films 113a to 113e. In an arrangement for preventing the light that has entered the first waveguide member 118 from leaking to the insulating member on the periphery, the first waveguide member 118 functions as a light waveguide. For example, a reflecting member configured to reflect light may be arranged on the side wall of the opening 116, and the first waveguide member 118 may fill the other portion of the opening 116. An air gap may exist between the first waveguide member 118 arranged in the opening 116 and the plurality of interlayer dielectric films 113a to 113e. The air gap may be a vacuum, or a gas may be arranged. In these cases, the refractive index of the material of the first waveguide member 118 and the refractive index of the material of the plurality of interlayer dielectric films 113a to 113e can have any magnitude relationship.

In this embodiment, a silicon oxide film serving as the fifth interlayer dielectric film 113e is arranged on the electrically conductive member of the second wiring layer 112b. Then, a silicon nitride film serving as the first waveguide member 118 is arranged on the fifth interlayer dielectric film 113e. Instead, an insulating member arranged on the electrically conductive member of the second wiring layer 112b may be a film other than the silicon oxide film. For example, silicon carbide (SiC) may be formed on the electrically conductive member of the second wiring layer 112b, and a silicon nitride film serving as the first waveguide member 118 may be formed on the SiC. The resistivity of SiC is low enough to function as an insulating member as compared to the resistivity of the electrically conductive member.

Next, in the step shown in FIG. 2A, a portion of the first waveguide member 118 arranged on the peripheral region 104 is removed. First, an etching mask (not shown) is formed on the first waveguide member 118. The etching mask has an opening on the peripheral region 104. Next, a portion of the first waveguide member 118 arranged on the peripheral region 104 is removed by etching.

At this time, the etching may be performed such that the portion of the first waveguide member 118 arranged on the peripheral region 104 may be left only in a predetermined film thickness. As described above, if the first waveguide member 118 of only the predetermined film thickness remains on the peripheral region 104, damage that the etching gives to the semiconductor substrate side can be reduced. Instead, the first waveguide member 118 may be removed until the fifth interlayer dielectric film 113e is exposed on the peripheral region 104.

In this embodiment, the entire portion of the first waveguide member 118 arranged on the peripheral region 104 is etched. In other words, no etching mask is arranged on the peripheral region 104. The area of the portion to be etched may be large in this way. Instead, only part of the portion of the first waveguide member 118 arranged on the peripheral region 104 may be etched. The area here means the area on a plane.

The method of removing the portion of the first waveguide member 118 arranged on the peripheral region 104 is not limited to etching. For example, part of the first waveguide member 118 may be removed by lift-off. More specifically, an underlying film is formed on the peripheral region 104 before the formation of the first waveguide member 118. When the underlying film is removed after the formation of the first waveguide member 118, part of the first waveguide member 118 arranged on the peripheral region 104 is also simultaneously removed. Note that part of the portion of the first waveguide member 118 arranged on the imaging region 103 may be removed in this step.

Figure 2B:
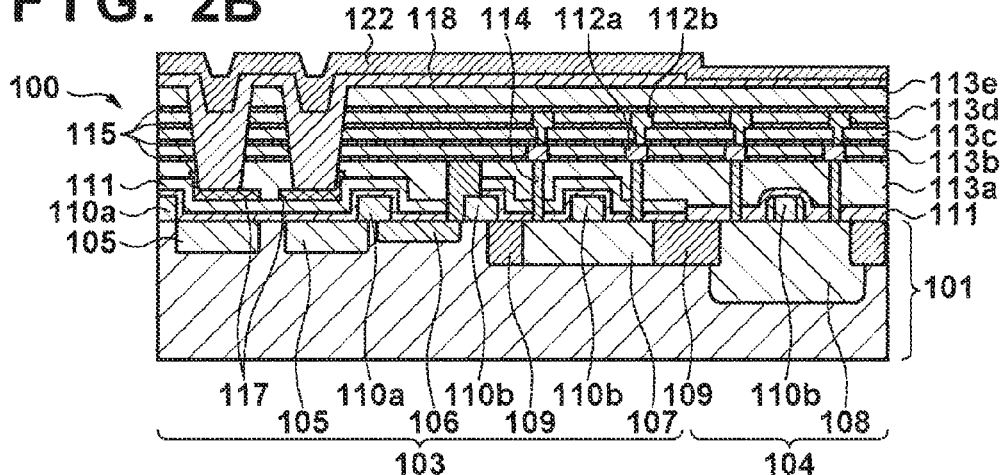

In the step shown in FIG. 2B, the second waveguide member 122 is formed on the opposite side of the semiconductor substrate 101 with respect to the first waveguide member 118. The second waveguide member 122 is formed on the imaging region 103 and the peripheral region 104. In this embodiment, the step of forming the first waveguide member 118 and the step of forming the second waveguide member 122 are different in that the step of removing the portion of the first waveguide member 118 arranged on the peripheral region 104 is performed between the two steps. For this reason, the second waveguide member 122 may be made of the same material as the first waveguide member 118. In addition, the second waveguide member 122 may be formed by the same method as the method of forming the first waveguide member 118. Instead, the second waveguide member 122 may be made of a material different from that of the first waveguide member 118. The second waveguide member 122 may be formed by a method different from the method of forming the first waveguide member 118.

In this embodiment, the first waveguide member 118 and the second waveguide member 122 are made of the same material. More specifically, the second waveguide member 122 is made of silicon nitride. In this case, the second waveguide member 122 can be formed by CVD or sputtering. Instead, the second waveguide member 122 may be formed by application of an organic material represented by a polyimide-based polymer.

In this embodiment, both the first waveguide member 118 and the second waveguide member are formed by CVD. The condition of the process may be changed between these members. Note that the second waveguide member 122 may be formed by a plurality of steps under different conditions. In addition, the second waveguide member 122 may be formed by sequentially forming a plurality of different materials.

Figure 2C:
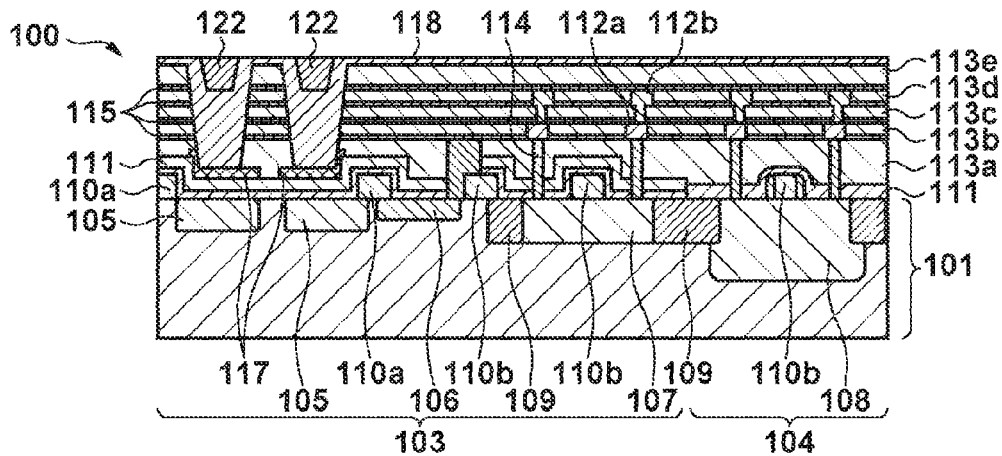

FIG. 2C shows a planarization step after the formation of the second waveguide member 122. In this embodiment, the upper surface of the stacked structure of the first waveguide member 118 and the second waveguide member 122 is planarized by CMP. The planarization can be done by a known method. For example, the planarization may be done by polishing or etching. By the planarization, a member located on the side of the semiconductor substrate 101 with respect to the first waveguide member 118 or the second waveguide member may be exposed. In this embodiment, on the peripheral region 104, the second waveguide member 122 is wholly removed, and the first waveguide member 118 is exposed. On the other hand, the second waveguide member 122 remains on the imaging region 103. Instead, the second waveguide member 122 may remain on the peripheral region 104.

Note that in the step of FIG. 2C, the surface of the second waveguide member 122 on the opposite side of the semiconductor substrate 101 need not completely be planarized. It is only necessary to reduce, by the planarization step, the step on the surface of the second waveguide member 122 on the opposite side of the semiconductor substrate 101 before the planarization. For example, on the peripheral region 104, the total film thickness of the first waveguide member 118 and the second waveguide member 122 after the planarization can fall within the range of 200 nm to 500 nm. In a region of the imaging region 103 where the opening 116 is not arranged, the total film thickness of the first waveguide member 118 and the second waveguide member 122 after the planarization may fall within the range of 50 nm to 350 nm. Note that in this embodiment, the surface of the second waveguide member 122 on the opposite side of the semiconductor substrate 101 is exposed in the planarization step. If another member is arranged on the second waveguide member 122, the exposed surface of the other member is planarized.

Figure 3A:
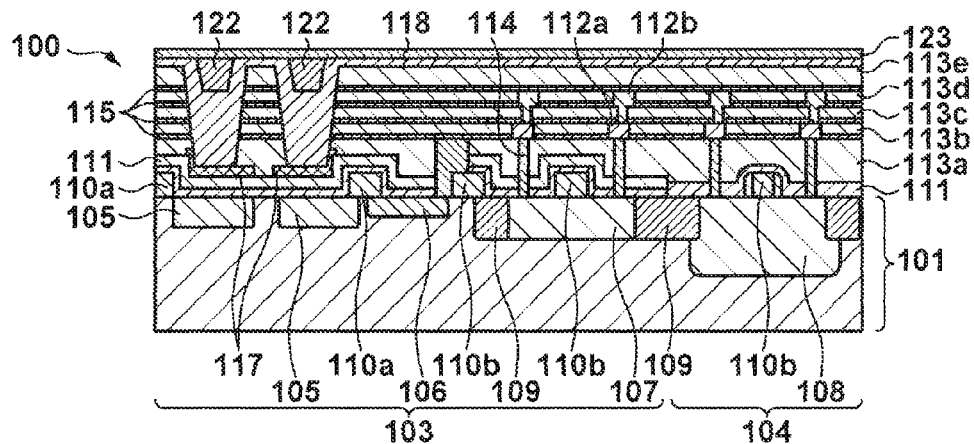
FIGS. 3A to 3C are views for explaining a solid-state image sensor manufacturing method according to some embodiments.

In the step shown in FIG. 3A, the low refractive index member 123 is formed. The refractive index of the low refractive index member 123 is lower than the refractive index of a member arranged on the side of the semiconductor substrate 101 with respect to the low refractive index member 123 and arranged in contact with the low refractive index member 123. The member arranged on the side of the semiconductor substrate 101 with respect to the low refractive index member 123 and arranged in contact with the low refractive index member 123 is, in other words, a member exposed before the formation of the low refractive index member 123. In this embodiment, the first waveguide member 118 and the second waveguide member 122 correspond to the exposed member. That is, in this embodiment, the refractive index of the low refractive index member 123 is lower than the refractive index of the first waveguide member 118 and the second waveguide member 122. More specifically, the low refractive index member 123 is made of a silicon oxynitride film. The refractive index of the silicon oxynitride film is about 1.72. Note that the low refractive index member 123 need not always be provided. If the low refractive index member 123 is not provided, the step of FIG. 3A can be omitted.

Figure 3B:
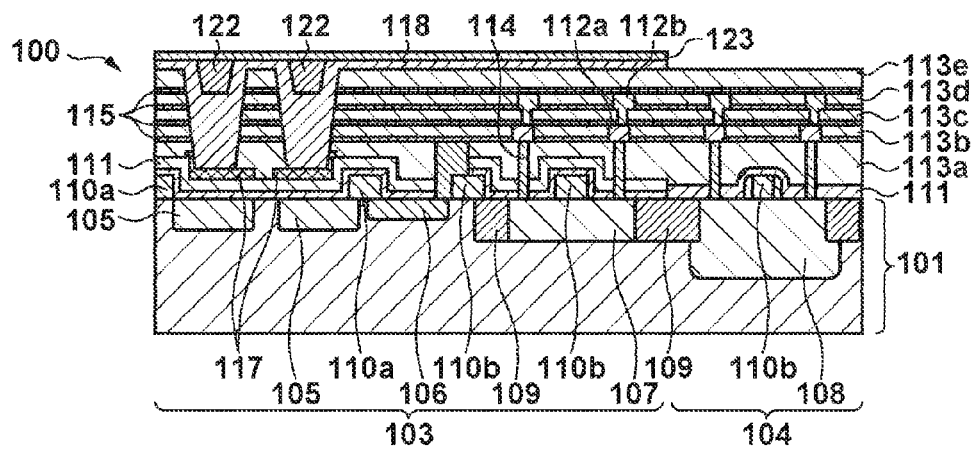

Next, in the step shown in FIG. 3B, the first waveguide member 118 and the like are partially removed such that a portion of the interlayer dielectric films 113 and the like that covers the connecting portion of the second wiring layer 112b is exposed. All the first waveguide member 118 and the like may be removed from the peripheral region 104. More specifically, at least part of the first waveguide member 118 and the low refractive index member 123 is removed such that a portion of the fifth interlayer dielectric film 113e that covers the connecting portion of the second wiring layer 112b is exposed. If part of the second waveguide member 122 remains on the peripheral region 104, this is also removed. In this step, of the first waveguide member 118 and the like, a portion located at a position to arrange the plug 121 to be described later and a portion located at a position within a predetermined distance from the position to arrange the plug 121 may be removed. The predetermined distance may be decided based on the diameter of the plug 121. Instead, the predetermined distance may be decided based on the overlay accuracy, minimum design size, or the like in the semiconductor process. A known method can be used as the removing method. For example, in this embodiment, a portion of the first waveguide member 118 and the like formed on the peripheral region 104 is removed by etching. Note that in this step, part of the first waveguide member 118 and the like arranged on the imaging region 103 may be removed.

Figure 3C:
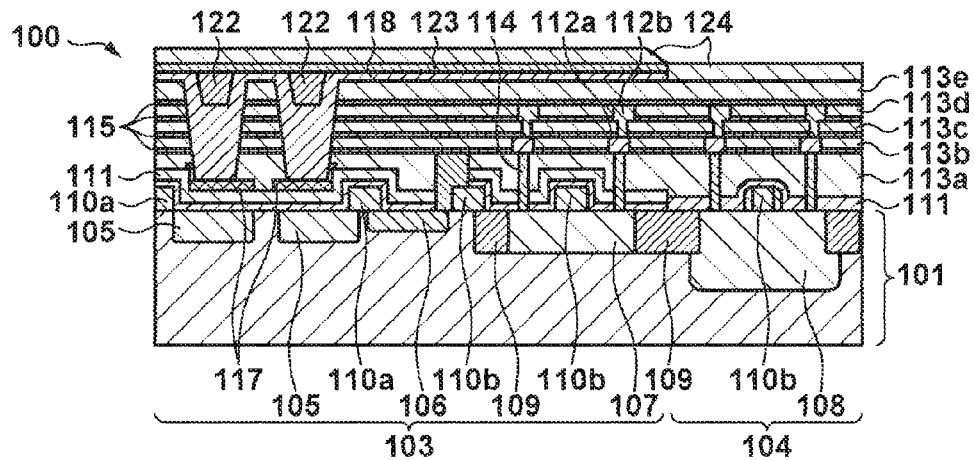

In the step shown in FIG. 3C, another insulating member is formed on the imaging region 103 and the peripheral region 104 of the semiconductor substrate 101. In this embodiment, the insulating member is formed from a sixth interlayer dielectric film 124. The sixth interlayer dielectric film 124 covers the interlayer dielectric films 113 and the like and the first waveguide member 118 and the like. The sixth interlayer dielectric film 124 may be made of the same material as the fifth interlayer dielectric film 113e. That is, the interlayer dielectric films 113 and the like and the sixth interlayer dielectric film 124 may contain the same material. The sixth interlayer dielectric film 124 is formed by a deposition apparatus using a plasma, for example, a high-density plasma method.

The upper surface of a portion of the sixth interlayer dielectric film 124 arranged on the peripheral region 104 may be flush with or higher than the upper surface of the portion of the first waveguide member 118 and the like located on the imaging region 103. In the above-described step, at least part of the portion of the first waveguide member 118 and the like arranged on the peripheral region 104 is removed. Hence, the upper surface of the portion of the sixth interlayer dielectric film 124 arranged on the peripheral region 104 is lower than the upper surface of the portion of the sixth interlayer dielectric film 124 arranged on the imaging region 103.

Figure 4A:
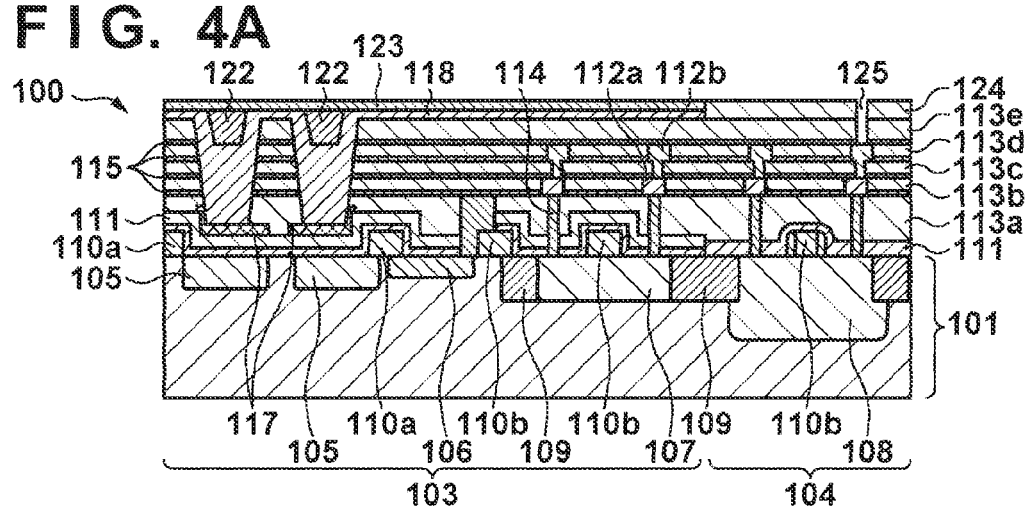
FIGS. 4A to 4C are views for explaining a solid-state image sensor manufacturing method according to some embodiments.

Next, as shown in FIG. 4A, the sixth interlayer dielectric film 124 is partially removed from the imaging region 103 to expose the first waveguide member 118 and the like. More specifically, the sixth interlayer dielectric film 124 is removed from the imaging region 103 such that the low refractive index member 123 is exposed. In this step, the sixth interlayer dielectric film 124 may entirely or only partially be removed from the imaging region 103. The above-described removal of the sixth interlayer dielectric film 124 may be done by resist etch-back, CMP, or patterning using photolithography. Instead, the sixth interlayer dielectric film 124 may be removed by plasma etching by performing photolithography using a negative resist of the photomask used in the step of FIG. 3B. When performing the above-described removal of the sixth interlayer dielectric film 124 by etching, the low refractive index member 123 may be used as an etching stop layer.

When the upper surface of the portion of the sixth interlayer dielectric film 124 arranged on the peripheral region 104 is higher than the upper surface of the portion of the first waveguide member 118 and the like located on the imaging region 103, the upper side of the portion of the sixth interlayer dielectric film 124 arranged on the peripheral region 104 may be removed. The removal of the upper side may be done such that the height difference between the upper surface of the portion of the sixth interlayer dielectric film 124 arranged on the peripheral region 104 and the upper surface of the portion of the first waveguide member 118 and the like located on the imaging region 103 is reduced.

Next, the through hole 125 (opening) that exposes the connecting portion of the second wiring layer 112b is formed in the interlayer dielectric films 113 and the like and the first waveguide member 118 and the like. The through hole 125 is formed by, for example, etching the fifth interlayer dielectric film 113e, the insulating film 115, and the sixth interlayer dielectric film 124. The area of the through hole 125 may be smaller than the area of the portion of the first waveguide member 118 and the like removed by the step of FIG. 3B.

Figure 4B:
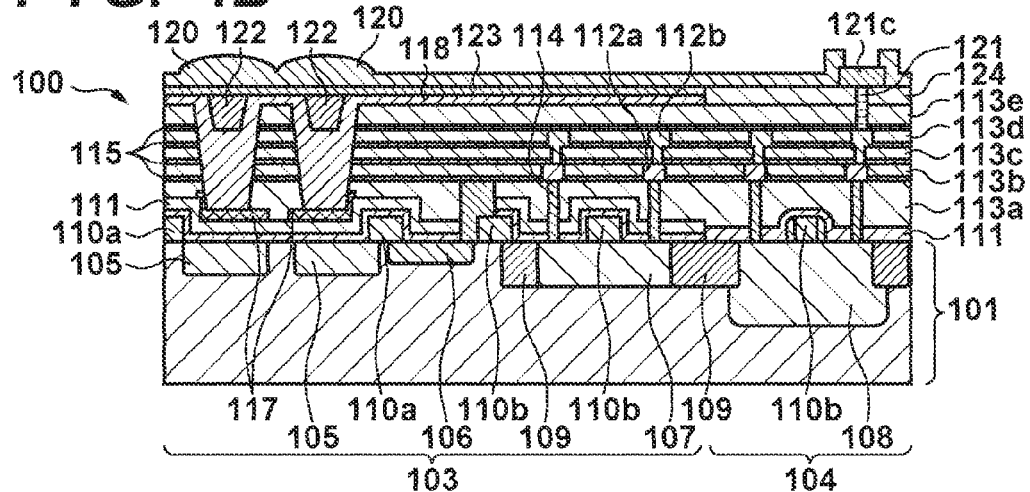

In the step shown in FIG. 4B, the plug 121, a third wiring layer 121c, and intralayer lenses 120 are formed. First, the plug 121 is formed in the through hole 125. The plug 121 electrically connects a predetermined electrically conductive member of the second wiring layer 112b and a predetermined electrically conductive member of the third wiring layer 121c. The plug 121 is made of, for example, tungsten. Any material can be used to form the plug 121 as long as it is a conductive material.

Next, the third wiring layer 121c is formed. In this embodiment, the electrically conductive member of the third wiring layer 121c is made of aluminum. Note that as the method of forming the third wiring layer 121c, the method described concerning the step of forming the first wiring layer 112a or the second wiring layer 112b is appropriately used. The electrically conductive member of the third wiring layer 121c may be made of a metal other than aluminum.

Additionally, in this step, the intralayer lenses 120 are formed. The intralayer lenses 120 are arranged in correspondence with the photoelectric conversion units 105. To form the intralayer lenses 120, first, an insulating member that comes into contact with the first waveguide member 118 and the like (more specifically, the low refractive index member 123) is formed on the imaging region 103 and the peripheral region 104 of the semiconductor substrate 101. In this embodiment, the insulating member is made of a silicon nitride film formed by plasma CVD or the like. After that, the upper surface of the silicon nitride film is processed into a lens shape (so as to form a spherical shape) by plasma etching or the like at positions corresponding to the plurality of openings 116, thereby forming the intralayer lenses 120. In this embodiment, the material to form the intralayer lenses 120 is arranged on the peripheral region 104 as well. However, the material to form the intralayer lenses 120 may be arranged only on the imaging region 103. The refractive index of the material to form the intralayer lenses 120 may be higher than the refractive index of the low refractive index member 123. After that, final alloying is performed for 10 min or more. The temperature of the final alloying may be 400° C. or more.

Figure 4C:
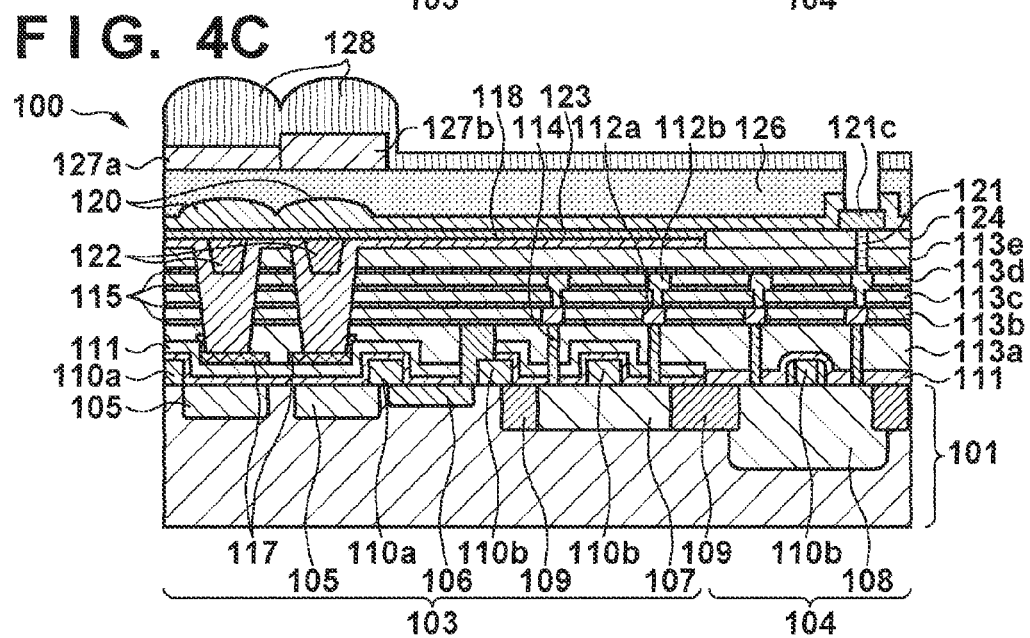

In the step shown in FIG. 4C, an eighth insulating film 126, color filters 127a and 127b, and microlenses 128 are formed. First, the eighth insulating film 126 is formed on the opposite side of the semiconductor substrate 101 with respect to the intralayer lenses 120. The eighth insulating film 126 is made of, for example, an organic material. The surface of the eighth insulating film 126 on the opposite side of the semiconductor substrate 101 is planarized as needed. For example, when the organic material of the eighth insulating film 126 is applied, the eighth insulating film 126 whose surface on the opposite side of the semiconductor substrate 101 is planarized can be formed.

Next, the color filters 127a and 127b are formed. The color filters 127a and 127b are arranged in correspondence with the photoelectric conversion units 105. The wavelength of light transmitted through the color filter 127a and the wavelength of light transmitted through the color filter 127b may be different. Subsequently, the microlenses 128 are formed on the opposite side of the semiconductor substrate 101 with respect to the color filters 127a and 127b. A known method can be used as the method of forming the microlenses 128.

Figure 5:
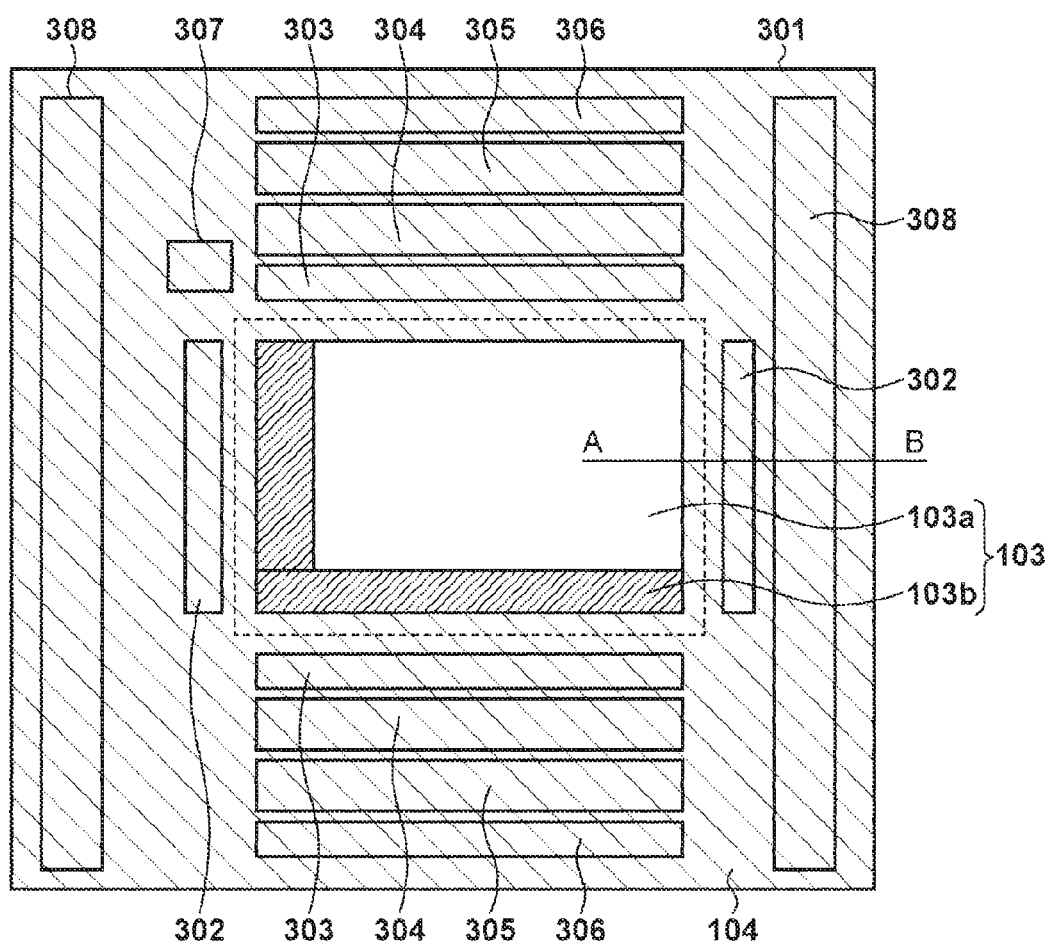
FIG. 5 is a view for explaining a solid-state image sensor manufacturing method according to some embodiments.

FIG. 5 is a schematic view showing the planar structure of the solid-state image sensor 100 according to this embodiment. FIGS. 1A to 4C show a section taken along a line A-B in FIG. 5. Referring to FIG. 5, the solid-state image sensor 100 includes the imaging region 103 and the peripheral region 104. The imaging region 103 may include a light receiving region 103a and a light shielding region 103b. A plurality of pixels are two-dimensionally arranged in the imaging region 103. The photoelectric conversion units of pixels arranged in the light shielding region 103b are shielded from light. A signal from such a pixel can be used as the reference of black level.

The peripheral region 104 is a region other than the imaging region 103. In this embodiment, vertical scanning circuits 302, horizontal scanning circuits 303, column amplifiers 304, column ADCs (Analog to Digital Convertors) 305, memories 306, a timing generator 307, and a plurality of pads 308 are arranged in the peripheral region 104. These circuits are circuits configured to process signals from the pixels. Note that some of the above-described circuits need not always be arranged.

In this embodiment, the region where the first waveguide member 118, the second waveguide member 122, and the low refractive index member 123 are removed is a region 301 outside the dotted lines in FIG. 5. In an example, portions of the first waveguide member 118, the second waveguide member 122, and the low refractive index member 123 which are arranged at least from the region to arrange the through hole 125 to a predetermined distance are removed.

In addition, if the dielectric constant of the first waveguide member 118 is larger than the fifth interlayer dielectric film 113e, the most portion of the peripheral region 104 may be the region 301, as shown in FIG. 5. Furthermore, the whole peripheral region 104 may be the region 301. The parasitic capacitance between wires can be reduced by removing the most portion of the first waveguide member 118 with a large dielectric constant.

According to the method of this embodiment, since the fifth interlayer dielectric film 113e and the sixth interlayer dielectric film 124 which are made of the same material are in contact with each other, the through hole 125 to arrange the plug 121 can easily be formed. In addition, the step between the imaging region 103 and the peripheral region 104 can be reduced before the formation of the intralayer lenses 120 by removing the portion of the sixth interlayer dielectric film 124 arranged on the imaging region 103.

Second Embodiment

A method of manufacturing a solid-state image sensor according to the second embodiment of the present invention will be described with reference to FIGS. 6A to 7C. The same reference numerals as in FIGS. 1A to 5 denote parts having the same functions in FIGS. 6A to 7C, and a detailed description thereof will be omitted. An insulating member, which is formed from the first waveguide member 118, the second waveguide member 122, and the low refractive index member 123 in the first embodiment, is formed from only the first waveguide member 118 in the second embodiment.

Figure 6A:
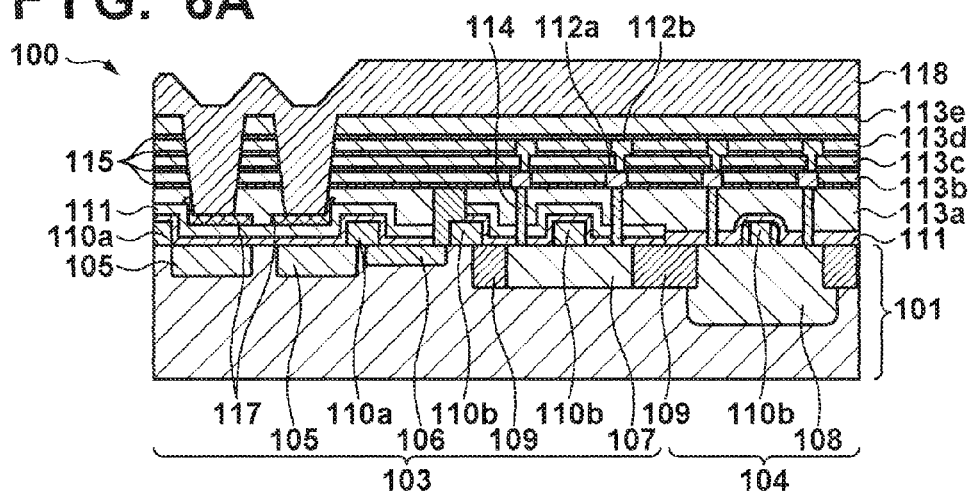
FIGS. 6A to 6C are views for explaining a solid-state image sensor manufacturing method according to some embodiments.

FIG. 6A shows the same step as that shown in FIG. 1C of the first embodiment. That is, FIG. 6A shows a state in which the first waveguide member 118 is formed on a plurality of interlayer dielectric films 113a to 113e in which openings 116 are formed. The steps up to FIG. 6A in the method of this embodiment are the same as the steps shown in FIGS. 1A to 1C of the first embodiment.

Figure 6B:
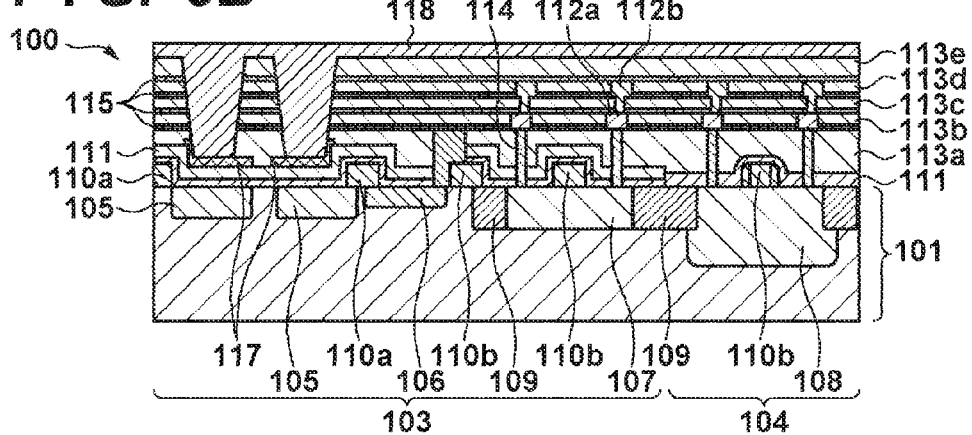

In the step of FIG. 6B, the surface of the first waveguide member 118 on the opposite side of a semiconductor substrate 101 is planarized. The planarization of the first waveguide member 118 is done by, for example, CMP, polishing, or etching. In this embodiment, the planarization is done by CMP.

Note that in the step of FIG. 6B, the surface of the first waveguide member 118 on the opposite side of the semiconductor substrate 101 need not be completely flat. It is only necessary to reduce, by the planarization step, the step on the surface of the first waveguide member 118 on the opposite side of the semiconductor substrate 101 before the planarization. For example, on a peripheral region 104, the film thickness of the first waveguide member 118 after the planarization may fall within the range of 200 nm to 500 nm. In a region of an imaging region 103 where the opening 116 is not arranged, the film thickness of the first waveguide member 118 after the planarization may fall within the range of 50 nm to 350 nm.

Note that in this embodiment, the surface of the first waveguide member 118 on the opposite side of the semiconductor substrate 101 is exposed in the planarization step. If another member is formed on the first waveguide member 118, the exposed surface of the other member is planarized.

Figure 6C:
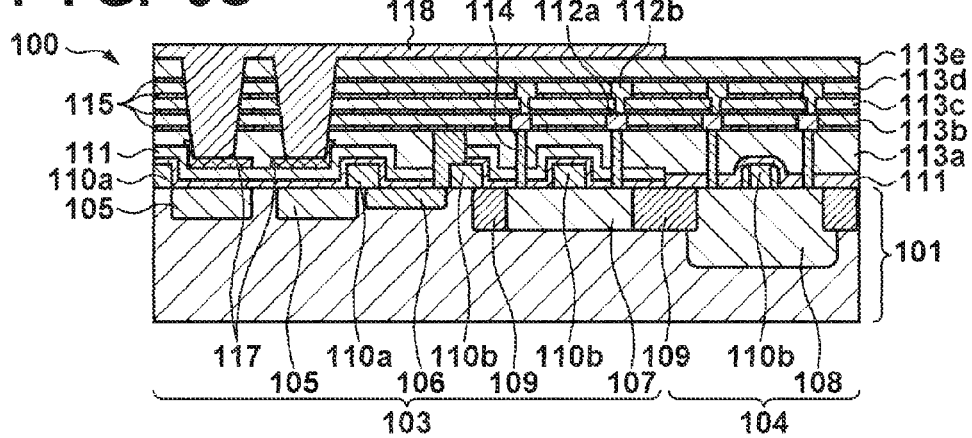

In the step of FIG. 6C, after the first waveguide member 118 is planarized, a step of removing a portion of the first waveguide member 118 formed on the peripheral region 104 is performed. In this step, portions of the first waveguide member 118 which are arranged at a position to arrange a plug 121 and from the position to arrange the plug 121 to a predetermined distance may be removed.

The steps from FIG. 7A may be the same as the steps from FIG. 3C of the first embodiment, and a description thereof will be omitted.

<First Modification>

Figure 8A:
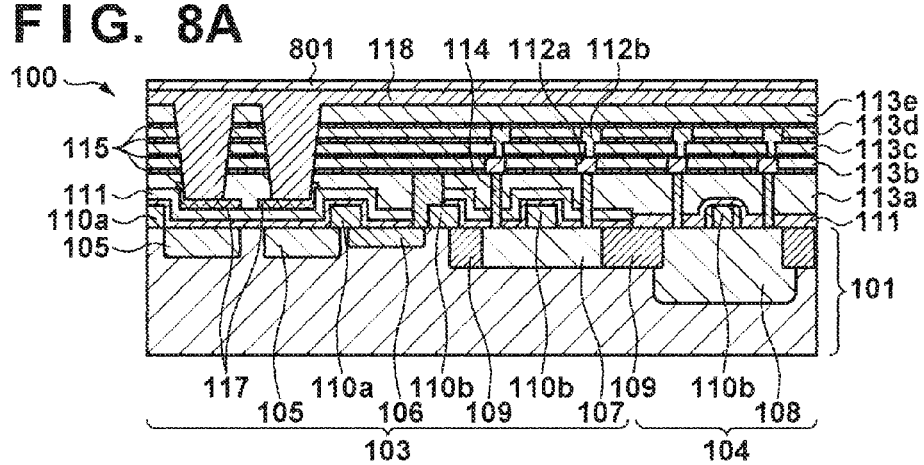
FIGS. 8A to 8C are views for explaining a modification of the solid-state image sensor manufacturing method.

A method of manufacturing a solid-state image sensor according to the first modification of the second embodiment of the present invention will be described with reference to FIGS. 8A to 8C. The same reference numerals as in the second embodiment denote parts having the same functions, and a detailed description thereof will be omitted. In the second embodiment, the planarization step shown in FIG. 6B is performed after the formation of the first waveguide member 118. In this modification, as shown in FIG. 7A, an insulating film 801 is formed on the planarized first waveguide member 118. The insulating film 801 may be formed to fill a portion of an opening 116 in which the first waveguide member 118 is not buried. In this case, the insulating film 801 may be made of the same material as the first waveguide member 118. In addition, the insulating film 801 may have the same function as the low refractive index member 123 according to the first embodiment, or may have another function.

Figure 8B:
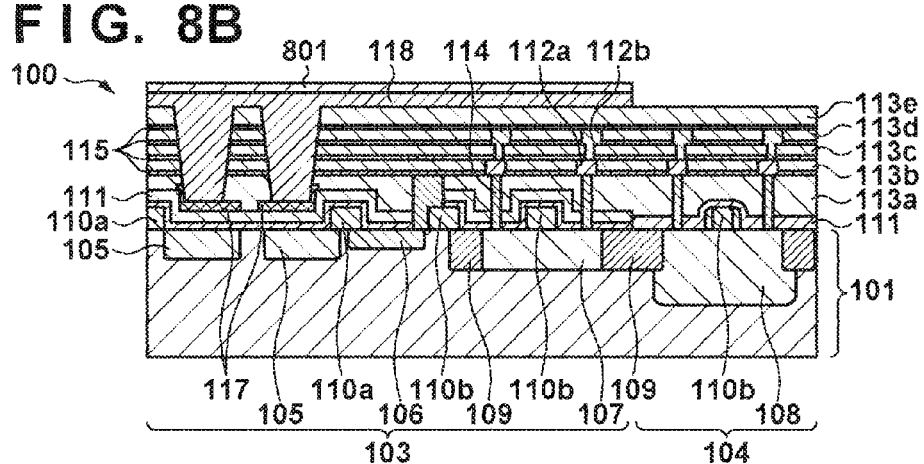

In the step of FIG. 8B, a portion of the first waveguide member 118 formed on the peripheral region 104 and a portion of the insulating film 801 formed on the peripheral region 104 are removed. Particularly in this step, portions of the first waveguide member 118 and the insulating film 801, which are arranged at a position to arrange the plug 121 and from the position to arrange the plug 121 to a predetermined distance are removed. A known method can be used as the removing method. For example, in this embodiment, portions of the first waveguide member 118 and the insulating film 801 formed on the peripheral region 104 are removed by etching.

Figure 8C:
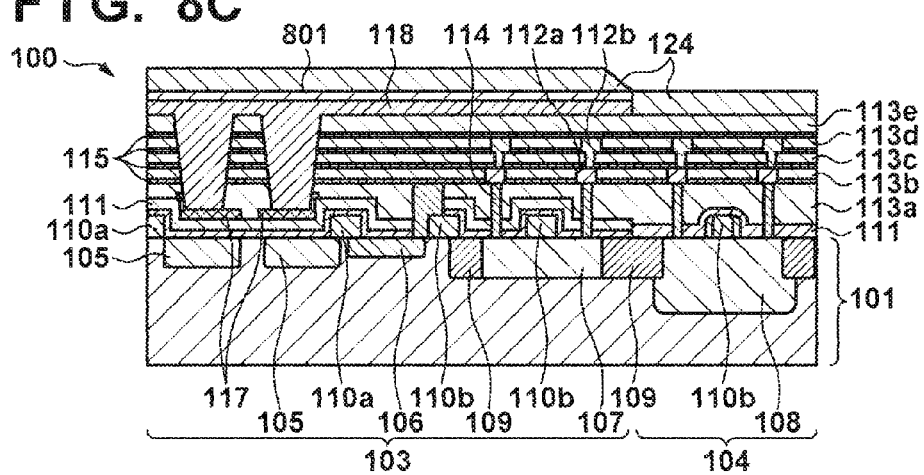

In the step of FIG. 8C, a seventh interlayer dielectric film 124 is formed, as in FIG. 7A. The steps from then on may be the same as in the second embodiment, and a description thereof will be omitted.

<Second Modification>

Figure 9A:
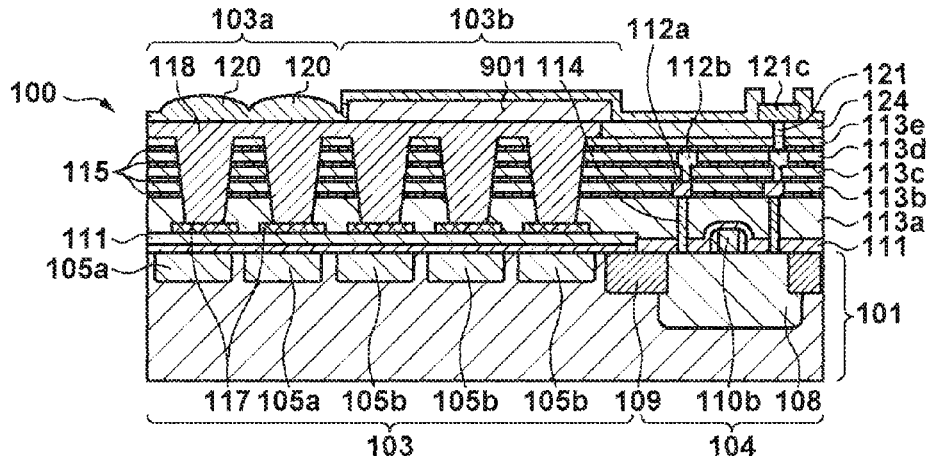
FIGS. 9A to 9C are views for explaining a modification of the solid-state image sensor manufacturing method.

A method of manufacturing a solid-state image sensor according to the second modification of the above-described first and second embodiments of the present invention will be described with reference to FIG. 9A. The second modification will be described below based on the second embodiment. However, the second modification can similarly be applied to the first embodiment. The same reference numerals as in the second embodiment denote parts having the same functions, and a detailed description thereof will be omitted.

In this modification, the imaging region 103 includes a light receiving region (effective pixel region) 103a and a light shielding region (optical black pixel region) 103b. The openings 116 are formed in correspondence with photoelectric conversion units 105a arranged in the light receiving region 103a and photoelectric conversion units 105b arranged in the light shielding region 103b. The first waveguide member 118 is formed in the openings 116. That is, a light waveguide is formed in each of the photoelectric conversion units 105a and 105b.

A light shielding member 901 is arranged on the light shielding region 103b. The light shielding member 901 is arranged on the opposite side of the semiconductor substrate 101 with respect to the first waveguide member 118. Light that enters the photoelectric conversion units 105b is at least partially shielded by the light shielding member 901. The light that enters the photoelectric conversion units 105b may be wholly shielded by the light shielding member 901. Alternatively, obliquely incident light sometimes enters the photoelectric conversion units 105b arranged on the light shielding region 103b. The light shielding member 901 has a function of reducing the amount of light that enters the photoelectric conversion units 105b as compared to the amount of light that enters the photoelectric conversion units 105a in a case in which the entire surface of the imaging region 103 is irradiated with a uniform amount of light.

In this modification, the light shielding member 901 is made of aluminum. The light shielding member 901 may be included in a third wiring layer 121c. That is, the light shielding member 901 may be made of the same material as the electrically conductive member included in the third wiring layer 121c. From the viewpoint of the manufacturing method, the light shielding member 901 may simultaneously be formed when forming the electrically conductive member included in the third wiring layer 121c. The light shielding member 901 may be formed by another method.

In this modification, at least portions of the first waveguide member 118 located at a position to arrange the plug 121 and in the region of a predetermined distance or less from the position to arrange the plug 121 are removed. However, a portion of the first waveguide member 118 arranged on the light shielding region 103b is not removed. An arrangement that does not remove the portion of the first waveguide member 118 arranged on the light shielding region 103b is merely an embodiment, and the portion of the first waveguide member 118 arranged on the light shielding region 103b may be removed.

<Third Modification>

Figure 9B:
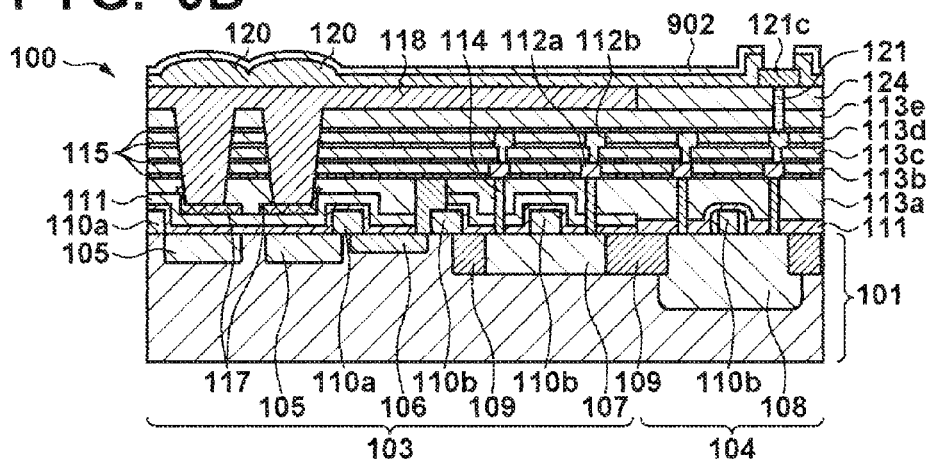

A method of manufacturing a solid-state image sensor according to the third modification of the above-described first and second embodiments of the present invention will be described with reference to FIG. 9B. The third modification will be described below based on the second embodiment. However, the third modification can similarly be applied to the first embodiment. The same reference numerals as in the second embodiment denote parts having the same functions, and a detailed description thereof will be omitted.

In this modification, after intralayer lenses 120 are formed, an insulating member 902 is formed on the insulating member that constitutes the intralayer lenses 120. The insulating member 902 is made of, for example, silicon oxynitride and formed by, for example, a plasma CVD method. The refractive index of the insulating member 902 can be lower than the refractive index of the intralayer lenses 120. After that, an operation is formed in a portion of the insulating member 902 on the third wiring layer 121c. The insulating member 902 can function as an anti-reflection film for the intralayer lenses 120.

<Fourth Modification>

Figure 9C:
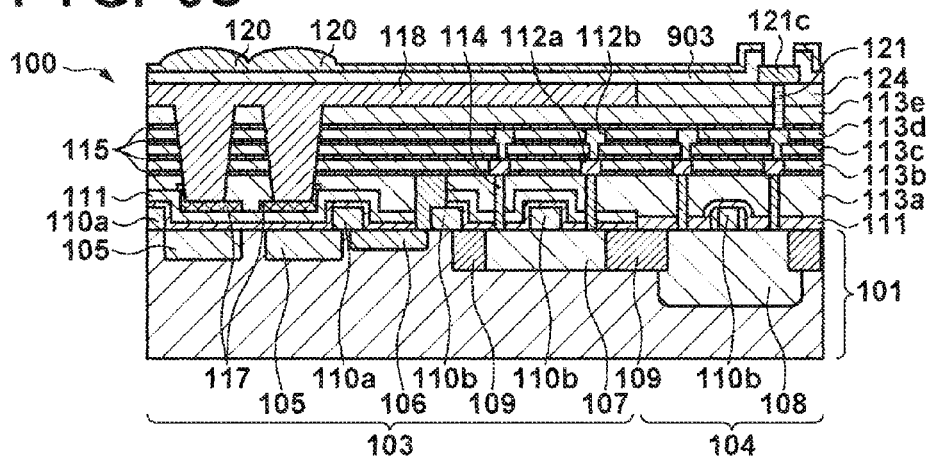

A method of manufacturing a solid-state image sensor according to the fourth modification of the above-described first and second embodiments of the present invention will be described with reference to FIG. 9C. The fourth modification will be described below based on the second embodiment. However, the fourth modification can similarly be applied to the first embodiment. The same reference numerals as in the second embodiment denote parts having the same functions, and a detailed description thereof will be omitted.

In this modification, after a through hole 125 is formed, an insulating member 903 is formed on the imaging region 103 and the peripheral region 104. The insulating member 903 is made of, for example, silicon oxynitride and formed by, for example, a plasma CVD method. After that, the intralayer lenses 120 are formed in accordance with the same procedure as in the second embodiment. The refractive index of the insulating member 903 can be lower than the refractive index of the intralayer lenses 120 and higher than the refractive index of the first waveguide member 118. With such a refractive index, the insulating member 903 functions as an anti-light reflection film between the intralayer lenses 120 and the first waveguide member 118.

Only one of the first to fourth modifications may be applied to the first or second embodiment, or a combination of two or more modifications may be applied.

As an application example of the solid-state image sensor according to each embodiment described above, a camera incorporating the solid-state image sensor will be exemplified. The concept of the camera includes not only an apparatus mainly aiming at shooting but also an apparatus (for example, a personal computer, a portable terminal, an automobile, or the like) having an auxiliary shooting function. The camera may be a module component such as a camera head. The camera includes a solid-state image sensor according to the present invention exemplified as an embodiment above, and a signal processing unit that processes a signal from the solid-state image sensor. The signal processing unit can include, for example, a processor that processes digital data based on a signal obtained from the solid-state image sensor. An A/D convertor configured to generate the digital data may be provided on the semiconductor substrate of the solid-state image sensor or may be provided on another semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-115706, filed Jun. 9, 2016, which is hereby incorporated by reference herein in its entirety.

What is claimed is:

1. A method of manufacturing a solid-state image sensor, comprising:
    forming a first insulating member and an electrically conductive member above a semiconductor substrate including a first region in which a plurality of photoelectric conversion units are arranged and a second region in which a circuit configured to process signals from the plurality of photoelectric conversion units is arranged, wherein the first insulating member covers the first region and the second region, the electrically conductive member is arranged above at least the second region, and a connecting portion of an upper surface of the electrically conductive member, which is used to connect a plug, is covered with part of the first insulating member;
    forming a plurality of first openings corresponding to the plurality of photoelectric conversion units in the first insulating member;
    forming a second insulating member above the first region and the second region after the forming the plurality of first openings, wherein the second insulating member covers the first insulating member, and a portion of the second insulating member formed in the first opening functions as a waveguide;
    partially removing the second insulating member such that the part of the first insulating member covering the connecting portion is exposed;
    forming a third insulating member that covers the first insulating member and the second insulating member above the first region and the second region after the partially removing the second insulating member;
    partially removing the third insulating member formed above the first region such that the second insulating member is exposed;
    forming a second opening to expose the connecting portion of the electrically conductive member in the first insulating member and the third insulating member after the partially removing the third insulating member; and
    forming the plug in the second opening.

2. The method according to claim 1, wherein in the forming the third insulating member, the third insulating member is formed such that an upper surface of a portion of the third insulating member arranged above the second region becomes higher than an upper surface of a portion of the second insulating member arranged above the first region.

3. The method according to claim 2, wherein in the forming the second opening, an upper side of the portion of the second insulating member arranged above the first region is removed such that a height difference between the upper surface of the portion of the third insulating member arranged above the second region and the upper surface of the portion of the second insulating member arranged on the first region is reduced.

4. The method according to claim 1, further comprising forming a fourth insulating member in contact with the second insulating member above the first region after the forming the plug,
    wherein the fourth insulating member has a refractive index higher than that of the second insulating member.

5. The method according to claim 4, further comprising processing an upper surface of the fourth insulating member into a lens shape at each of positions corresponding to the plurality of first openings.

6. The method according to claim 5, further comprising forming a fifth insulating member on the fourth insulating member after the processing the fourth insulating member into the lens shape,
    wherein the fifth insulating member has a refractive index lower than that of the fourth insulating member.

7. The method according to claim 4, further comprising forming a sixth insulating member above the first region between the forming the plug and the forming the fourth insulating member,
    wherein the sixth insulating member has a refractive index higher than that of the second insulating member and lower than that of the fourth insulating member.

8. The method according to claim 1, wherein in the partially removing the third insulating member, the third insulating member is removed from above the first region by etching using the second insulating member as an etching stop layer.

9. The method according to claim 1, wherein in the forming the second opening, the third insulating member is wholly removed from above the first region.

10. The method according to claim 1, wherein in the partially removing the second insulating member, the second insulating member is wholly removed from above the second region.

11. The method according to claim 1, wherein the second insulating member is made of a material different from the first insulating member.

12. The method according to claim 1, wherein the first insulating member and the third insulating member contain the same material.

13. The method according to claim 1, wherein an area of the second opening is smaller than an area of at least part of the second insulating member removed in the partially removing the second insulating member.

14. The method according to claim 1, wherein the second insulating member includes at least a first layer, and a second layer arranged on the first layer and having a refractive index lower than that of the first layer.

15. The method according to claim 14, wherein the first layer is formed in the first opening, and
the second layer is formed above the first opening.

16. The method according to claim 15, wherein the first layer is made of silicon nitride, and the second layer is made of silicon oxynitride.

17. The method according to claim 1, wherein the forming the second insulating member includes forming a first layer, forming, on the first layer, a third layer made of the same material as the first layer, and planarizing an upper surface of a stacked structure of the first layer and the third layer.

* * * * *